United States Patent [19]

Brady

[11] Patent Number: 5,331,228
[45] Date of Patent: Jul. 19, 1994

[54] OUTPUT DRIVER CIRCUIT

[75] Inventor: James Brady, Dallas, Tex.

[73] Assignee: SGS-Thomson Microelectronics, Inc., Carrollton, Tex.

[21] Appl. No.: 923,135

[22] Filed: Jul. 31, 1992

[51] Int. Cl.[5] .................. H03K 19/00; H03K 19/0948
[52] U.S. Cl. .................... 307/473; 307/443; 307/451
[58] Field of Search ............... 307/443, 473, 451, 360, 307/475, 530

[56] References Cited

U.S. PATENT DOCUMENTS

| | | | |
|---|---|---|---|
| 4,570,091 | 2/1986 | Yasuda et al. | 307/530 |
| 4,571,104 | 2/1986 | Iwamoto et al. | 307/451 |
| 4,797,579 | 1/1989 | Lewis | 307/475 |
| 4,891,792 | 1/1990 | Hanamura et al. | 307/530 |
| 4,983,860 | 1/1991 | Yim et al. | 307/451 |
| 5,025,181 | 6/1991 | Farmer | 307/451 |
| 5,073,726 | 12/1991 | Kato et al. | 307/443 |
| 5,126,974 | 6/1992 | Sasaki et al. | 307/530 |
| 5,194,763 | 3/1993 | Suzuki et al. | 307/443 |

OTHER PUBLICATIONS

Rhyne *Fundamentals of Digitial Systems Design*. Prentice Hall: New Jersey. 1973, pp. 70-71.

*Primary Examiner*—Edward P. Westin
*Assistant Examiner*—Jon Santamauro
*Attorney, Agent, or Firm*—Kenneth C. Hill; Lisa K. Jorgenson; Richard K. Robinson

[57] ABSTRACT

An output driver circuit includes a sense amplifier coupled to a first inverter and a second inverter. The first and second inverters drive a first and second chain of logic gates, respectively. A p-channel output transistor is coupled to the output of the first chain of logic gates, and an n-channel output transistor is coupled to the output of the second chain of logic gates. The transistors in the first and second inverters are selected so that the first inverter and the second inverter have complementary preferential output states. The first and second inverters generate their preferential output state in response to a selected intermediate output voltage range from the sense amplifier to turn off both the n-channel transistor and the p-channel transistor. This causes the n-channel and p-channel output transistors to both turn off when the sense amplifier generates the intermediate voltage during an equilibrate period.

5 Claims, 2 Drawing Sheets

OUTPUT DRIVER CIRCUIT

BACKGROUND OF THE INVENTION

1. Technical Field

The present invention relates generally to integrated circuits, and more specifically to a circuit which utilizes an output driver circuit to output data from a sense amplifier.

2. Description of the Related Art

Typically, a sense amplifier is utilized to read data from a memory in an integrated circuit. During each read cycle, the sense amplifier senses voltage levels in a selected memory cell and outputs data in the form of a high or low voltage level. In between read cycles, the sense amplifier is equilibrated in preparation for the next read cycle. Equilibrating the sense amplifier can be accomplished by setting the bit lines and the complementary bit lines to the same voltage level.

A problem can arise, however, with the data output from the integrated circuit during an equilibrate time period. During the equilibrate time period, the sense amplifier will not be reading an actual value from the memory. As a result, the output from the sense amplifier can be an intermediate value between logical one and zero. Depending on how this value is read by other devices or output buffers, short duration output voltage swings can occur. This causes undesirable noise internally, due to the high currents drawn by typical output drivers, and on the external data bus coupled to the data output.

Therefore, it would be desirable to provide an output driver circuit which eliminates noise from data output from an integrated circuit when a sense amplifier is equilibrated in preparation for another read cycle.

SUMMARY OF THE INVENTION

An output driver circuit includes a sense amplifier coupled to a first inverter and a second inverter. The first and second inverters drive a first and second chain of logic gates, respectively. A p-channel output transistor is coupled to the output of the first chain of logic gates, and an n-channel output transistor is coupled to the output of the second chain of logic gates. The transistors in the first and second inverters are selected so that the first inverter and the second inverter have complementary preferential output states. The first and second inverters generate their preferential output state in response to a selected intermediate output voltage range from the sense amplifier to turn off both the n-channel transistor and the p-channel transistor. This causes the n-channel and p-channel output transistors to both turn off when the sense amplifier generates the intermediate voltage during an equilibrate period.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
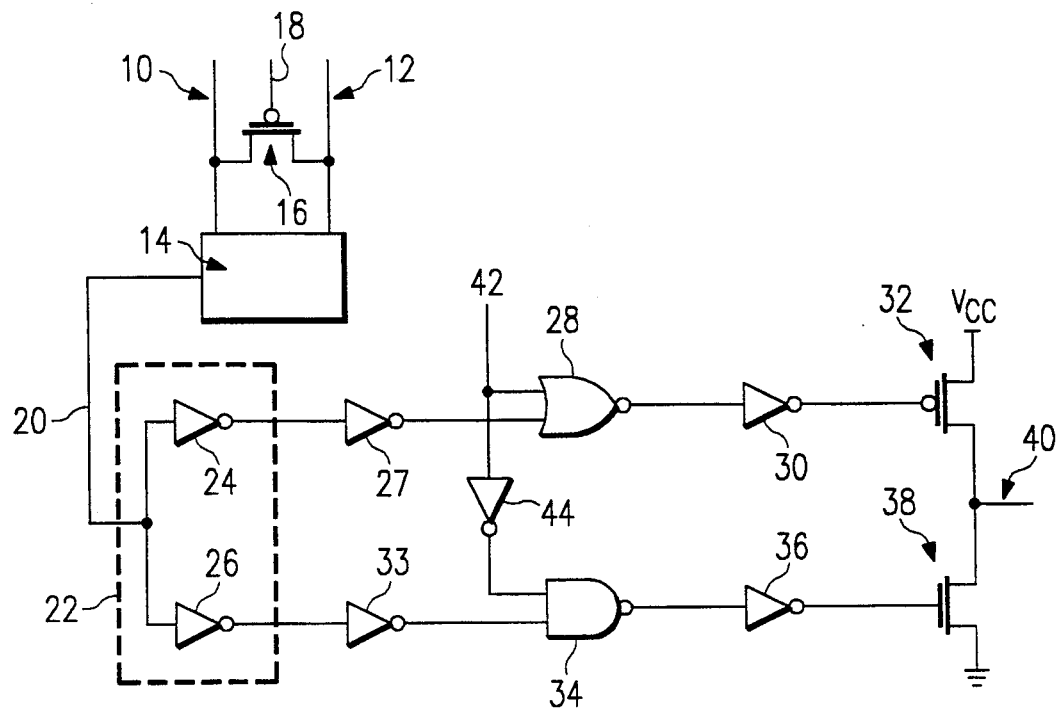
FIG. 1 is a block diagram of a preferred embodiment of an output driver circuit according to the present invention.

Referring to FIG. 1, a block diagram of a preferred embodiment of an output driver circuit is illustrated according to the present invention. Two signal lines 10, 12 are input into a sense amplifier 14. Signal lines 10, 12 are complementary data lines which are derived from memory array bit lines and are connected together by a transistor 16. Transistor 16 is preferably a p-channel transistor and is utilized to set data lines 10, 12 to the same voltage level. It is desirable to equilibrate, or set data lines 10, 12 to the same voltage level, when equilibrating the sense amplifier 14 in preparation for reading data from a memory array (not shown). To do this, an equilibrate signal (EQ) is applied to signal line 18, which is an input to the gate of transistor 16, to equilibrate data lines 10, 12 to the same voltage level. In the preferred embodiment, transistor 16 turns on and equilibrates data lines 10, 12 when the EQ signal is low.

Figure 4:
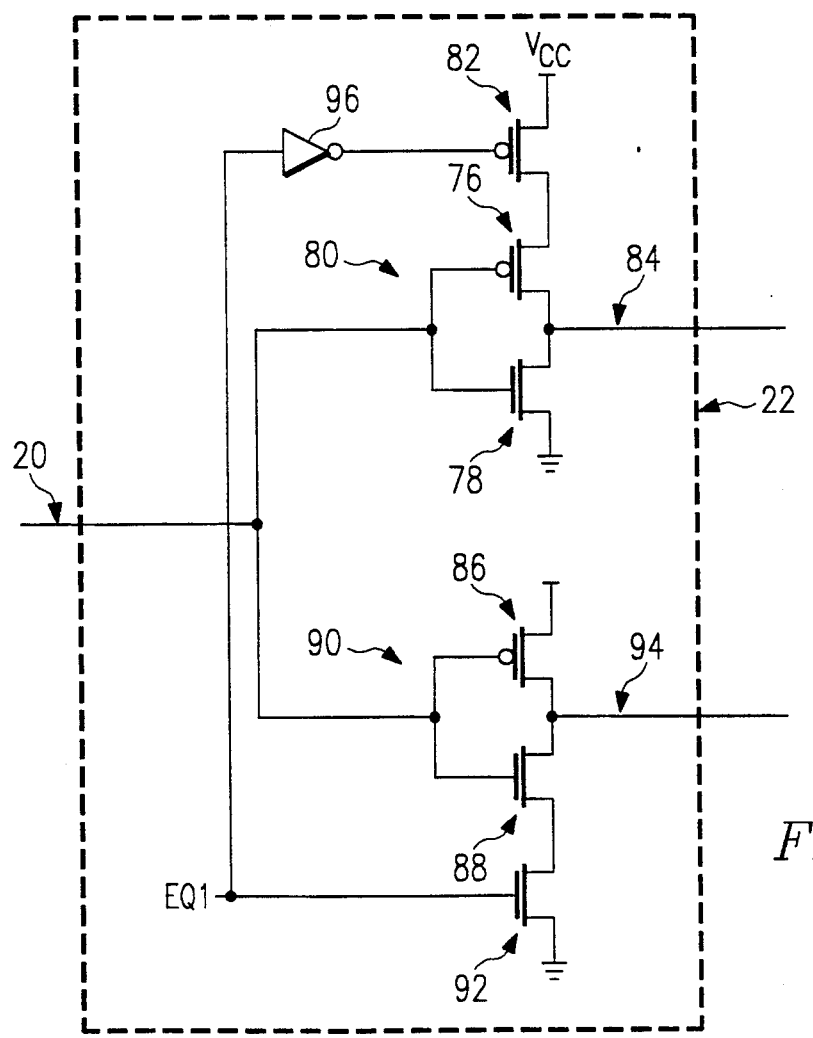
FIG. 4 is an alternative detailed view of a portion of the output driver circuit illustrated in FIG. 1 according to the present invention.

The output signal line 20 of sense amplifier 14 enters block 22. In the embodiment of the invention illustrated in FIG. 1, block 22 contains a first inverter 24 and a second inverter 26. An alternative embodiment to block 22 is illustrated in FIG. 4, and will be discussed in greater detail below.

A first chain of logic gates is connected to the output of first inverter 24. The first chain of logic gates includes an inverter 27, a NOR gate 28 and an inverter 30. A p-channel output transistor 32 is connected to the output of the inverter 30. A second chain of logic gates is connected to the output of second inverter 26, and includes an inverter 33, a NAND gate 34 and an inverter 36. An n-channel output transistor 38 is connected to the output of the inverter 36. As can be seen, p-channel output transistor 32 and n-channel output transistor 38 are connected in series, and data output signal line 40 originates from the common node between the p-channel output transistor 32 and the n-channel output transistor 38.

Still referring to FIG. 1, an output enable (OE) signal is applied to signal line 42 and provides an input into NOR gate 28. An inverter 44 inverts the OE signal, and the inverted OE signal is input into NAND gate 34. If OE is high both transistors 32, 38 are turned off, and output 40 is tri-stated. If OE is low, data output signal line 40 has the inverse value of the signal on line 20, with p-channel and n-channel output transistors 32, 38 on or off depending upon the signal.

A problem can arise when the sense amplifier 14 is being equilibrated in preparation for another read cycle. During that period of time, the sense amplifier 14 may not output valid data because the voltage level on output signal line 20 can be an intermediate value. If the intermediate voltage level is on the other side of the trip point for inverters 24, 26 from the previously generated data value, the signal on the data output signal line 40 can change state and cause noise on data output signal line 40.

For example, assume that the signal on output signal line 20 is low during a read cycle. While the sense amplifier 14 is being equilibrated, the voltage level on output signal line 20 is driven to an intermediate level. If this level is higher than their trip point, first e inverter 24 and second inverter 26 both change state. This causes the signal on data output signal line 40 to swing from a high to a low voltage level. Then, if during the next read cycle the signal on output signal line 20 is again low, the signal on data output signal line 40 swings back to a high voltage level. This results in a very short low output pulse between two high output levels. This shifting from a high to a low back to a high voltage level causes undesirable noise on data output signal line 40, and on any external data bus coupled to data output signal line 40.

To avoid creating undesirable noise on data output signal line 40, it would be useful to turn off both the p-channel output transistor 32 and the n-channel output transistor 38 during the equilibrate period of time for the sense amplifier 14. This would tri-state the output, and prevent such voltage swings. One method which can be utilized to do this is illustrated in FIG. 2.

Figure 2:
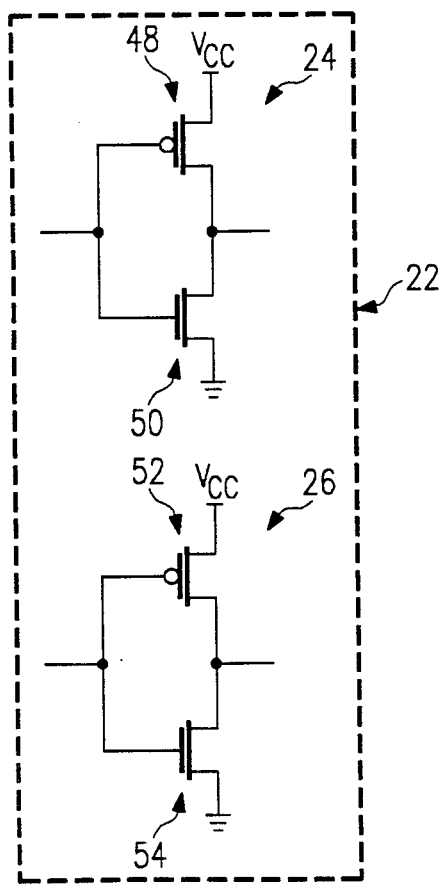
FIG. 2 is a detailed view of a portion of the output driver circuit illustrated in FIG. 1 according to the present invention.

FIG. 2 depicts a detailed view of block 22 in FIG. 1. First inverter 24 is comprised of a p-channel transistor 48 and an n-channel transistor 50 connected in series, and second inverter 26 is comprised of a p-channel transistor 52 and an n-channel transistor 54 also connected in series. Transistors 48, 50, 52, and 54 are selected so that first inverter 24 and second inverter 26 have complementary preferential output states. The term preferential output state means the inverter has a switching trip point which is offset from a mid-point voltage, so that an intermediate input voltage causes the inverter to always generate a known, preferred, output value.

The preferential output states of first inverter and second inverter 26 are determined by the size ratios of transistors 48, 50, 52 and 54. The ratio of p-channel transistor 48 to the other p-channel transistor 52, the ratio of the n-channel transistor 50 to the other n-channel transistor 54, and the ratios of the p-channel to the n-channel transistors within first inverter 24 and second inverter 26 are selected in order to determine the preferential output state of first inverter 24 and second inverter 26. For example, in one operative embodiment, p-channel transistor 48 is smaller than p-channel 52, and n-channel transistor 54 is smaller than n-channel transistor 50. This causes first inverter 24 to have a low preferential output state, and second inverter 26 to have a high preferential output state.

The table below illustrates how the circuit functions by listing the possible values on signal line 20, for the outputs of first inverter 24 and second inverter 26, and for the signal on data output signal line 40.

| signal line 20 | first inverter 24 | second inverter 26 | data output signal line 40 |
| --- | --- | --- | --- |
| low | high | high | high |
| high | low | low | low |
| mid | low | high | tri-state |

The term "mid" in the column for sense amplifier 14 represents the period of time during which the sense amplifier 14 is being equilibrated and the signal on output signal line 20 moves to an intermediate voltage level.

"Tri-state" is listed in the column for data output signal line 40 because both the p-channel and n-channel output transistors 32, 38 are turned off, and the output circuitry of FIG. 1 is completely isolated from data output signal line 40. If the load is mostly capacitive, the signal on data output signal line 40 does not change; it keeps the state it had before the sense amplifier 16 is equilibrated. If the load includes a resistive load coupled to a voltage source, the output on data output signal line 40 will begin changing in the direction of the voltage source. The amount of change in the output changes depends upon the size of the voltage source and the resistance and capacitance values of the load.

Figure 3:
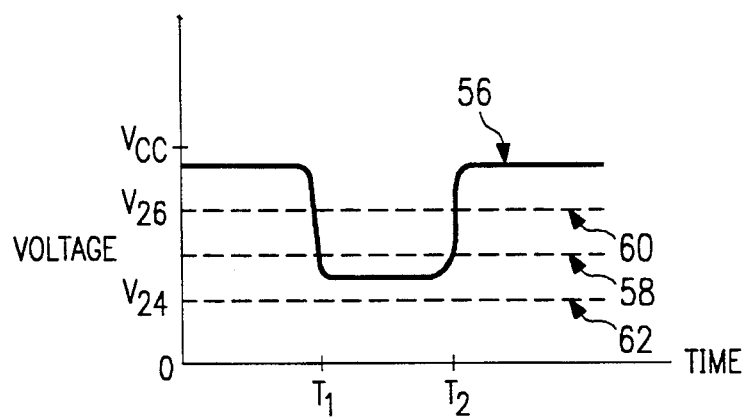
FIG. 3 is a graphic illustration of the voltage levels which activate the output driver circuit according to the present invention.

FIG. 3 is a graphic illustration of the voltage levels which activate the output driver circuit according to the present invention. Line 56 represents the signal on output signal line 20. FIG. 3 shows the end of a read cycle and the beginning of the next read cycle, with the equilibrate period between them. Line 58 represents the switching trip point for a typical inverter. Line 60 represents the voltage level or switching trip point for second inverter 26. Line 62 represents the voltage level or switching trip point for first inverter 24. As can be seen, the switching trip point 60 for second inverter 26 is skewed upward in comparison to a typical inverter, and the switching trip point 62 for first inverter 24 is skewed downward.

After a high output during one read cycle, the sense amplifier 14 is equilibrated at time $T_1$. During the equilibrate time period, time $T_1$ to $T_2$, the signal on output signal line 20 becomes an intermediate value somewhere in between 0 and Vcc volts. Due to the skewed switching trip points of first inverter 24 and second inverter 26, second inverter 26 is tripped and switches its output from a low to a high. First inverter however, is not tripped and its output remains low. Therefore, in the preferred embodiment, the preferential output state for first inverter 24 is low, and the preferential output state for second inverter 26 is high. As long as the voltage level on output signal line 20 is between line 60 and line 62, first inverter 24 and second inverter 26 will output their respective preferential output states. These preferential output states tri-state the output and prevent voltage swings.

FIG. 4 illustrates an alternative embodiment to block 22 in FIG. 1. A p-channel transistor 76 and an n-channel transistor 78 form one inverter 80. A p-channel transistor 82 is connected in series with the p-channel transistor 76 of inverter 80. As described in connection with FIG. 2, transistors 76, 78 and 82 are selected so that output signal line 84 has a preferential output state.

A p-channel transistor 86 and an n-channel transistor 88 form a second inverter 90. An n-channel transistor 92 is connected in series with the n-channel transistor 88 of inverter 90. As described in connection with FIG. 2, transistors 86, 88 and 92 are selected so that output signal line 94 has a preferential output state. Finally, an $EQ_1$ signal is an input into n-channel transistor Inverter 96 inverts the $EQ_1$ signal, and the inverted $EQ_1$ signal is input into p-channel transistor 82. The signal $EQ_1$ may be the same signal as EQ in FIG. 1 or may be derived from it or related to in in some other manner. Generally, $EQ_1$ should change state substantially during the sense amplifier equilibrate period.

When the $EQ_1$ signal is low, p-channel transistor 82 and n-channel transistor 92 are turned off, causing output line 84 to be low and output line 94 to be high. Normally, with an input voltage on output signal line 20 at an intermediate state, both the n-channel transistor 78 and p-channel transistor 86 will be partially on, with output lines 84, 94 closer to the supply voltage or zero, but not completely at one voltage level. Adding p-channel transistor 82 and n-channel transistor 92 causes a more complete shift to the preferential output state. Thus, in this embodiment, $EQ_1$ signal acts as a masking, or blanking, signal, forcing the inverters 80, 90 to go to their preferential state.

During normal sensing by the sense amplifier 14, the signal $EQ_1$ is high. This turns both transistors 82, 92 on, and the inverters 80, 90 operate normally, inverting the data on signal line 20. Thus, the only effect of driving the transistors 82, 92 from the $EQ_1$ signal is to force the outputs of the inverters to the preferential state during equilibration, rather than driving them there solely because of the ratios of the p-channel and n-channel transistors in them.

The output driving circuitry described above therefore provides for tri-stating the final output stage during sense amplifier equilibration. This can be done simply by providing appropriately sized transistors in the inverters driven by the sense amplifier, or by forcing them to preferential output states by gating the equilibrate signal.

While the invention has been particularly shown and described with reference to a preferred embodiment, it will be understood by those skilled in the art that various changes in form and detail may be made therein without departing from the spirit and scope of the invention.

What is claimed is:

1. An output driver circuit, comprising:
    a sense amplifier having an output;
    a first inverter and a second inverter coupled to said sense amplifier, each inverter having one-channel transistor and one p-channel transistor, wherein said first inverter and said second inverter are utilized to drive a first and second chain of logic gates respectively, and wherein the transistors in the first inverter and the second inverter are selected so that said first inverter and said second inverter have complementary preferential output states, said first inverter consisting of an additional p-channel transistor in series with its p-channel transistor and said second inverter consisting of an additional n-channel transistor in series with its n-channel transistor, wherein the additional transistors force the inverters to the preferential output states when receiving a gating signal; and
    a p-channel output transistor coupled to said first chain of logic gates and an n-channel output transistor coupled to said second chain of logic gates, wherein the first and second inverters generate their preferential output states in response to an intermediate voltage range from the sense amplifier to turn off both the n-channel output transistor and the p-channel output transistor.

2. The circuit of claim 1, wherein said sense amplifier reads a memory and said gating signal is derived from an equilibrate signal form the memory, and wherein the gating signal drives the first additional transistor in the first inverter and the second additional transistor in the second inverter.

3. The circuit of claim 2, wherein said equilibrate signal is utilized to set a data line and a complementary data line within the memory to an equivalent voltage level.

4. The circuit of claim 2, wherein the data line and the complementary data line within the memory are set to the equivalent voltage level when said equilibrate signal comprises a low voltage level.

5. The circuit of claim 1, wherein the sizes of the n-channel and the p-channel transistors in the first and second inverters are selected so that the first and second inverters have the complementary preferential output state.

* * * * *